(12) United States Patent
Goto (10) Patent No.: US 10,553,775 B2
(45) Date of Patent: Feb. 4, 2020

(54) ELECTRONIC CIRCUIT, OSCILLATOR, QUANTUM BIT, AND COMPUTING DEVICE

(71) Applicant: KABUSHIKI KAISHA TOSHIBA, Tokyo (JP)

(72) Inventor: Hayato Goto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 15/901,274

(22) Filed: Feb. 21, 2018

(65) Prior Publication Data
US 2018/0358539 A1 Dec. 13, 2018

(30) Foreign Application Priority Data

Jun. 12, 2017 (JP) ................................. 2017-115175

(51) Int. Cl.
*H01L 39/22* (2006.01)
*H03L 7/26* (2006.01)
(Continued)

(52) U.S. Cl.
CPC ........... *H01L 39/223* (2013.01); *G06N 10/00* (2019.01); *H03B 15/003* (2013.01); *H03L 7/26* (2013.01)

(58) Field of Classification Search
CPC ..................................................... H01L 39/223
(Continued)

(56) References Cited

U.S. PATENT DOCUMENTS 2,735,941 A * 2/1956 Peck .................... H03B 5/1835
330/53
4,785,426 A * 11/1988 Harada .................. G11C 11/44
327/528
(Continued)

FOREIGN PATENT DOCUMENTS

| JP | 4303286 | 7/2009 |
| JP | 2017-7316 | 1/2017 |
| JP | 2017-73106 | 4/2017 |

OTHER PUBLICATIONS

Goto; "Bifurcation-based adiabatic quantum computation with a nonlinear oscillator network," Scientific Reports, 6, 21686, pp. 1-8, (2016).

(Continued)

*Primary Examiner* — Joseph Chang
(74) *Attorney, Agent, or Firm* — Finnegan, Henderson, Farabow, Garrett & Dunner, L.L.P.

(57) ABSTRACT

According to one embodiment, an electronic circuit includes a first current path, a second current path, and a third current path. The first current path includes a first Josephson junction. The second current path includes a second Josephson junction. The third current path includes a plurality of third Josephson junctions. One end of the second current path is electrically connected to one end of the first current path. Another end of the second current path is electrically connected to another end of the first current path. One end of the third current path is electrically connected to the one end of the first current path and the one end of the second current path. Another end of the third current path is electrically connected to the other end of the first current path and the other end of the second current path.

18 Claims, 9 Drawing Sheets

(51) Int. Cl.
*G06N 10/00* (2019.01)
*H03B 15/00* (2006.01)

(58) Field of Classification Search
USPC .................................................. 331/99, 65
See application file for complete search history.

(56) References Cited

U.S. PATENT DOCUMENTS

| 7,369,093 B2 | 5/2008 | Oppenlander et al. |
| 2004/0150398 A1* | 8/2004 | Champion ............... H03D 7/00 324/260 |
| 2017/0104493 A1 | 4/2017 | Goto |

OTHER PUBLICATIONS

Goto; "Universal quantum computation with a nonlinear oscillator network," Physical Review A, vol. 93, pp. 050301-1 To 050301-4, (2016).
Lin et al.; "Josephson parametric phase-locked oscillator and its application to dispersive readout of superconducting qubits," Nature Communications, pp. 1-6, (2014).
Neilinger et al.; "Two-photon lasing by a superconducting qubit," Physical Review, vol. 91, pp. 104516-1 To 104516-4, (2015).

* cited by examiner

ELECTRONIC CIRCUIT, OSCILLATOR, QUANTUM BIT, AND COMPUTING DEVICE

CROSS-REFERENCE TO RELATED APPLICATIONS

This application is based upon and claims the benefit of priority from Japanese Patent Application No. 2017-115175, filed on Jun. 12, 2017; the entire contents of which are incorporated herein by reference.

FIELD

Embodiments described herein relate generally to an electronic circuit, an oscillator, a quantum bit, and a computing device.

BACKGROUND

A nonlinear element that utilizes an electronic circuit including a loop including a Josephson junction has been proposed; and a computing device that utilizes a network of the nonlinear elements has been proposed.

DETAILED DESCRIPTION

According to one embodiment, an electronic circuit includes a first current path, a second current path, and a third current path. The first current path includes a first Josephson junction. The second current path includes a second Josephson junction. The third current path includes a plurality of third Josephson junctions. One end of the second current path is electrically connected to one end of the first current path. Another end of the second current path is electrically connected to another end of the first current path. One end of the third current path is electrically connected to the one end of the first current path and the one end of the second current path. Another end of the third current path is electrically connected to the other end of the first current path and the other end of the second current path.

According to one embodiment, an oscillator includes an electronic circuit. The electronic circuit includes a first current path, a second current path, a third current path, and a first electromagnetic wave application portion. The first current path includes a first Josephson junction. The second current path includes a second Josephson junction. The third current path includes a plurality of third Josephson junctions. One end of the second current path is electrically connected to one end of the first current path. Another end of the second current path is electrically connected to another end of the first current path. One end of the third current path is electrically connected to the one end of the first current path and the one end of the second current path. Another end of the third current path is electrically connected to the other end of the first current path and the other end of the second current path. The first electromagnetic wave application portion applies an electromagnetic wave to each of a first region and a second region. The first region is surrounded with the first current path and the third current path. The second region is surrounded with the second current path and the third current path. The electronic circuit is caused to oscillate by the first electromagnetic wave application portion modulating each of a first flux and a second flux. The first flux is inside the first region. The second flux is inside the second region.

According one embodiment, a computing device includes a first oscillator and a second oscillator. The second oscillator is coupled to the first oscillator. Each of the first oscillator and the second oscillator includes an electronic circuit. The electronic circuit includes a first current path, a second current path, a third current path, and a first electromagnetic wave application portion. The first current path includes a first Josephson junction. The second current path includes a second Josephson junction. The third current path includes a plurality of third Josephson junctions. One end of the second current path is electrically connected to one end of the first current path. Another end of the second current path is electrically connected to another end of the first current path. One end of the third current path is electrically connected to the one end of the first current path and the one end of the second current path. Another end of the third current path is electrically connected to the other end of the first current path and the other end of the second current path. The first electromagnetic wave application portion applies an electromagnetic wave to each of a first region and a second region. The first region is surrounded with the first current path and the third current path. The second region is surrounded with the second current path and the third current path. The electronic circuit is caused to oscillate by the first electromagnetic wave application portion modulating each of a first flux and a second flux. The first flux is inside the first region. The second flux is inside the second region.

According to one embodiment, a quantum bit includes an electronic circuit. The electronic circuit includes a first current path, a second current path, and a third current path. The first current path includes a first Josephson junction. The second current path includes a second Josephson junction. The third current path includes a plurality of third Josephson junctions. One end of the second current path is electrically connected to one end of the first current path. Another end of the second current path is electrically connected to another end of the first current path. One end of the third current path is electrically connected to the one end of the first current path and the one end of the second current path. Another end of the third current path is electrically connected to the other end of the first current path and the other end of the second current path.

Embodiments will now be described with reference to the drawings.

The drawings are schematic or conceptual; and the relationships between the thicknesses and widths of portions, the proportions of sizes between portions, etc., are not necessarily the same as the actual values thereof. There are also cases where the dimensions and/or the proportions are illustrated differently between the drawings, even in the case where the same portion is illustrated.

In this specification and each drawing, components similar to ones described in reference to an antecedent drawing are marked with the same reference numerals; and a detailed description is omitted as appropriate.

First Embodiment

Figure 1:
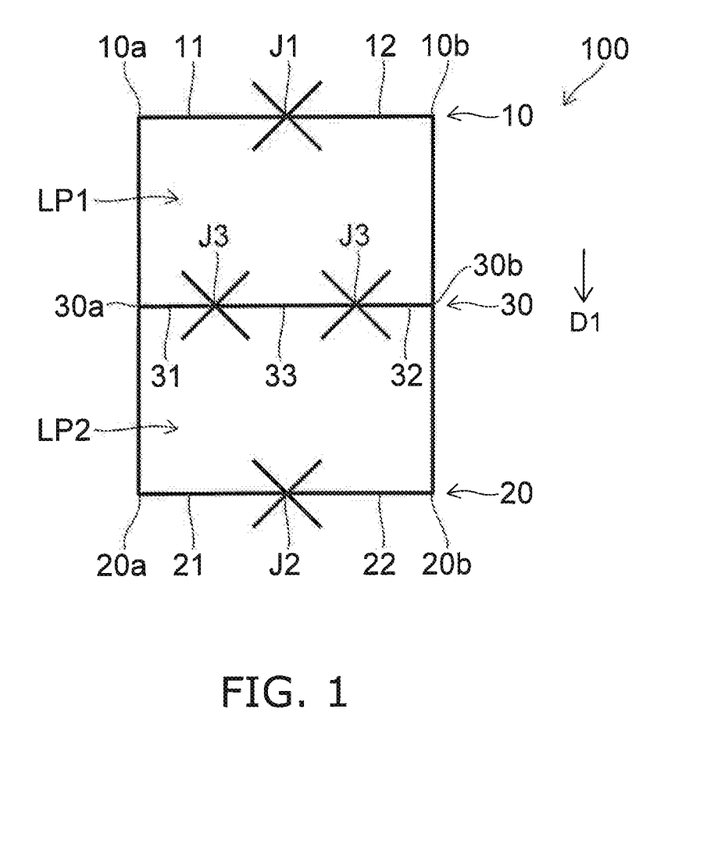
FIG. 1 is a schematic view illustrating an electronic circuit according to a first embodiment.

FIG. 1 is a schematic view illustrating an electronic circuit according to a first embodiment.

FIG. 1 schematically illustrates the electronic circuit 100 according to the first embodiment as a circuit diagram. The electronic circuit 100 includes a third current path 30, a second current path 20, and a first current path 10 provided on a substrate.

The first current path 10 includes at least one Josephson junction (a first Josephson junction 31). In the example shown in FIG. 1, a number N1 (an integer of 1 or more) of the Josephson junctions included in the first current path 10 is 1. For example, the first current path 10 includes a conductive portion 11 (a superconductor) and a conductive portion 12 (a superconductor). The conductive portion 11 and the conductive portion 12 are connected to each other by the first Josephson junction 31. In the Josephson junction, for example, an insulating layer is provided between two superconductors (e.g., the conductive portions 11 and 12).

The second current path 20 includes at least one Josephson junction (a second Josephson junction 32). In the example shown in FIG. 1, a number N2 (an integer of 1 or more) of the Josephson junctions included in the second current path 20 is 1. For example, the second current path 20 includes a conductive portion 21 (a superconductor) and a conductive portion 22 (a superconductor). The conductive portion 21 and the conductive portion 22 are connected to each other by the second Josephson junction 32.

For example, the third current path 30 is inside the same surface (e.g., a plane) as the first current path 10 and the second current path. For example, the third current path 30 is positioned between the first current path 10 and the second current path 20. The third current path 30 includes at least two Josephson junctions (third Josephson junctions 33). In the example shown in FIG. 1, a number N3 (an integer of 2 or more) of the Josephson junctions included in the third current path 30 is 2. For example, the third current path 30 includes conductive portions 31 to 33 (superconductors). The conductive portion 33 is provided between the conductive portion 31 and the conductive portion 32, The conductive portion 31 and the conductive portion 33 are connected to each other by the third Josephson junction 33. The conductive portion 32 and the conductive portion 33 are connected to each other by the third Josephson junction J3. Thus, in each of the first to third current paths, the multiple Josephson junctions are arranged in series in the case where the multiple Josephson junctions are provided.

For example, N3 is larger than N1 and larger than N2. In other words, the number of the third Josephson junctions 33 is larger than the number of the first Josephson junctions 31 and larger than the number of the second Josephson junctions J2. However, in the electronic circuit 100, N3 may be N1 or less, and may be N2 or less.

For example, N1 is equal to N2. In other words, the number of the first Josephson junctions 31 is equal to the number of the second Josephson junctions J2. However, N1 and N2 may be different in the electronic circuit 100.

The electronic circuit 100 has a loop structure.

As shown in FIG. 1, one end 20a of the second current path 20 is electrically connected to one end 10a of the first current path 10. The one end 10a and the one end 20a may be the same point. Another conductive portion (superconductor) may be provided between the one end 10a and the one end 20a.

Another end 20b of the second current path 20 is electrically connected to another end 10b of the first current path 10. The other end 10b and the other end 20b may be the same point. Another conductive portion may be provided between the other end 10b and the other end 20b.

Thus, the electronic circuit 100 includes one loop including the first current path 10 and the second current path 20.

The third current path 30 subdivides the loop into two.

One end 30a of the third current path 30 is electrically connected to the one end 10a of the first current path 10 and the one end 20a of the second current path 20. The one end 30a may be the same point as the one ends 10a and 20a. Another conductive portion (superconductor) may be provided between the one end 30a and the one end 10a. Another conductive portion (superconductor) may be provided between the one end 30a and the one end 20a.

Another end 30b of the third current path 30 is electrically connected to the other end 10b of the first current path 10 and the other end 20b of the second current path 20. The other end 30b may be the same point as the other ends 10b and 20b. Another conductive portion (superconductor) may be provided between the other end 30b and the other end 10b. Another conductive portion (superconductor) may be provided between the other end 30b and the other end 20b. Thus, the first to third current paths are connected in parallel. Thereby, the electronic circuit 100 includes a first loop LP1 and a second loop LP2.

The first loop LP1 is a loop formed of the first current path 10 and the third current path 30. The second loop LP2 is a loop formed of the second current path 20 and the third current path 30. The first loop LP1 and the second loop LP2 share the third current path 30.

As shown in FIG. 1, the position of a portion of the third current path 30 in a first direction D1 is between the position of a portion of the first current path 10 in the first direction D1 and the position of a portion of the second current path 20 in the first direction D1. Here, the first direction D1 is, for example, the direction from the first current path 10 toward a portion of the second current path 20.

The positions of the third Josephson junctions J3 in the first direction D1 are between the position of the first Josephson junction J1 in the first direction D1 and the position of the second Josephson junction 32 in the first direction. Here, the first direction D1 is, for example, the direction from the first Josephson junction 31 toward the second Josephson junction J2.

The conductive portions (the conductive portions 11, 12, 21, 22, and 31 to 33) of the electronic circuit 100 are, for example, interconnects provided on the substrate. These interconnects include, for example, aluminum (Al), niobium (Nb), etc., and transition to superconductors by cooling. The insulating layer that is provided in the Josephson junction includes, for example, aluminum oxide.

According to the embodiment, such a novel electronic circuit 100 is provided. For example, the electronic circuit 100 is used in an oscillator and/or a quantum bit.

The case where the electronic circuit 100 is used in an oscillator will now be described.

Second Embodiment

Figure 2A:
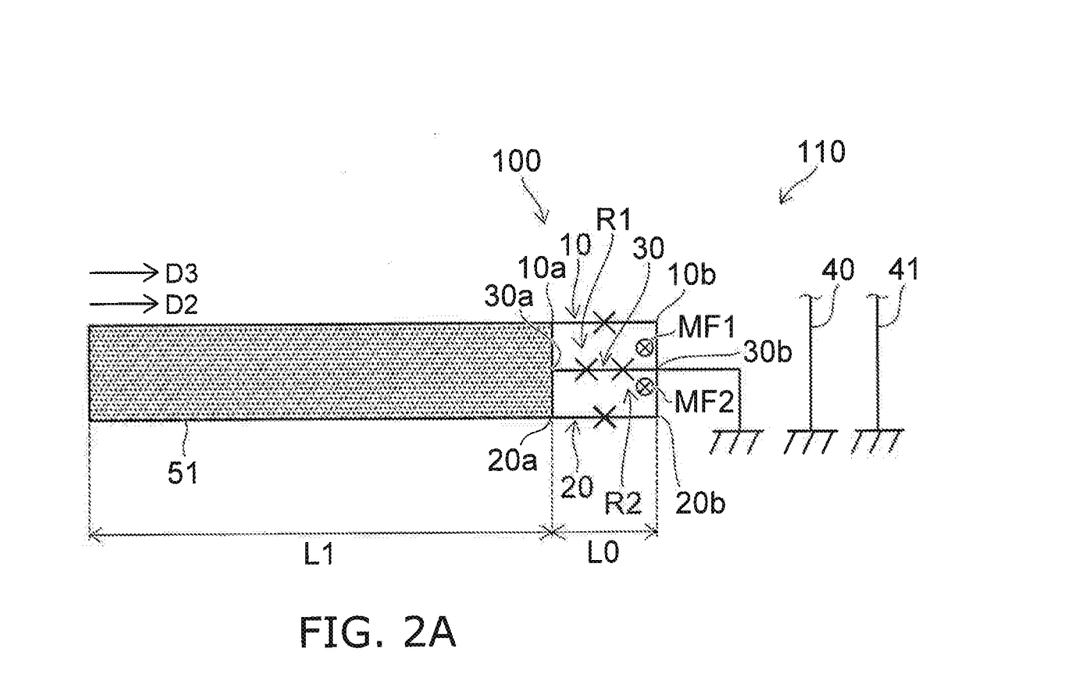
FIG. 2A and FIG. 2B are schematic views illustrating oscillators according to a second embodiment.
Figure 2B:
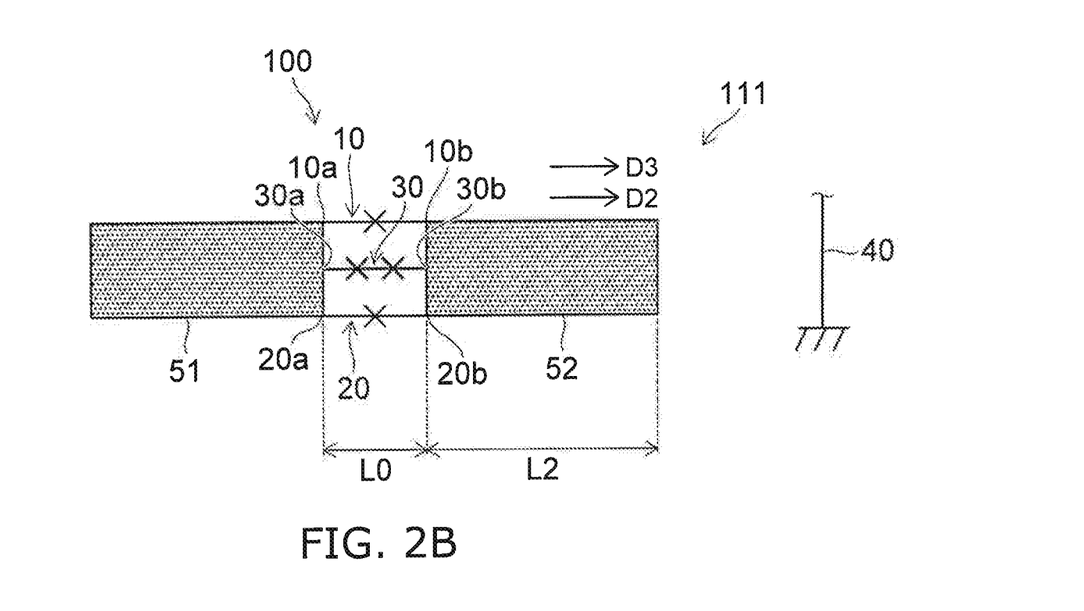

FIG. 2A and FIG. 2B are schematic views illustrating oscillators according to a second embodiment.

FIG. 2A and FIG. 2B schematically illustrate portions of oscillators 110 and 111 according to the second embodiment as circuit diagrams.

As shown in FIG. 2A, the oscillator 110 according to the second embodiment includes the electronic circuit 100, an electromagnetic wave application portion 40 (a first electromagnetic wave application portion), and a waveguide portion 51 (a first waveguide portion).

The oscillator 110 is a superconducting nonlinear resonator including Josephson junctions. The oscillator 110 has the loop structure (the first loops LP1 and LP2) described above. In such a loop structure, it is possible to control the effective Josephson energy due to the multiple Josephson junctions by the flux inside the loops. The oscillator 110 (the electronic circuit 100) can oscillate according to the change of the flux inside the first loop LP1 and the second loop LP2.

The electromagnetic wave application portion 40 applies an electromagnetic wave to the electronic circuit 100. The electromagnetic wave application portion 40 is, for example, a conductive portion in which an external current exciting the oscillation mode of the loops flows. A varying magnetic field is generated by a high frequency current flowing in the electromagnetic wave application portion 40. Thereby, the electromagnetic wave application portion 40 functions as a flux adjustment mechanism controlling the flux inside the loops.

In other words, the electromagnetic wave application portion 40 applies an electromagnetic wave into the interior of the first loop LP1 (a first region R1 surrounded with the first current path 10 and the third current path 30) including the first current path 10 and the third current path 30. Thereby, the electromagnetic wave application portion 40 modulates the flux (a first flux MF1) inside the first region R1.

The electromagnetic wave application portion 40 applies the electromagnetic wave to the interior of the second loop LP2 (a second region R2 surrounded with the second current path 20 and the third current path 30) including the second current path 20 and the third current path 30. Thereby, the electromagnetic wave application portion 40 modulates the flux (a second flux MF2) inside the second region R2. The electronic circuit 100 oscillates due to the modulation of the first flux MF1 and the modulation of the second flux MF2.

For example, the electromagnetic wave application portion 40 sets the dc component (the direct current component not changing temporally) of the flux inside the second region R2 to be not less than 0.8 times and not more than 1.2 times the dc component of the flux inside the first region R1. More favorably, the dc component of the flux inside the second region R2 is substantially equal to (e.g., not less than 0.9 times and not more than 1.1 times) the dc component of the flux inside the first region R1.

A magnetic field application portion 41 (a first magnetic field application portion) is further provided in the example shown in FIG. 2A. The magnetic field application portion 41 is, for example, a conductive portion in which an external current flows. The magnetic field application portion 41 adjusts the dc flux inside the first loop LP1 and the dc flux inside the second loop LP2 (the dc components of the flux) by a direct current flowing in the magnetic field application portion 41. The magnetic field application portion 41 may be the same as the electromagnetic wave application portion 40. In other words, the dc flux inside the loop may be adjusted by the current flowing through the electromagnetic wave application portion 40. In such a case, the magnetic field application portion 41 may be omitted. The magnetic field application portion 41 is omitted from the following oscillators.

For example, the configuration of the second loop LP2 is substantially the same as the configuration of the first loop LP1. For example, the configuration of the second loop LP2 has line symmetry with the configuration of the first loop LP1 around the third current path 30 as an axis of symmetry. For example, the surface area of the second region R2 is not less than 0.9 times and not more than 1.1 times the surface area of the first region R1.

The waveguide portion 51 is a conductive portion that is electrically connected to the electronic circuit 100. The waveguide portion 51 is electrically connected to each of the one end 10a of the first current path 10, the one end 20a of the second current path 20, and the one end 30a of the third current path 30. For example, a length L1 along a second direction D2 of the waveguide portion 51 is longer than a length L0 along a third direction D3 of the electronic circuit 100. The second direction D2 is, for example, the transmission direction of the waveguide portion (e.g., the direction in which the waveguide portion extends). The third direction D3 is, for example, the direction in which the third current path 30 extends.

The other end 10b of the first current path 10, the other end 20b of the second current path 20, and the other end 30b of the third current path 30 each are connected to a ground potential.

The oscillator 111 illustrated in FIG. 2B further includes a waveguide portion 52 (a second waveguide portion). The waveguide portion 52 is a conductive portion that is electrically connected to the electronic circuit 100. In the oscillator 111, the other end 10b of the first current path 10, the other end 20b of the second current path 20, and the other end 30b of the third current path 30 each are electrically connected to the waveguide portion 52. For example, a length L2 along the second direction D2 of the waveguide portion 52 is longer than the length L0 along the third direction D3 of the electronic circuit 100. Otherwise, the oscillator 111 is similar to the oscillator 110 shown in FIG. 2A.

For example, materials similar to the conductive portions of the electronic circuit 100 are used as the materials of the waveguide portion 51 and the waveguide portion 52. The materials of the waveguide portion 51 and the waveguide portion 52 may be different from the materials of the conductive portions of the electronic circuit 100. The oscillation state of the oscillator 110 (the electronic circuit 100) can be read via each of the waveguide portion 51 and the waveguide portion 52.

Figure 3A:
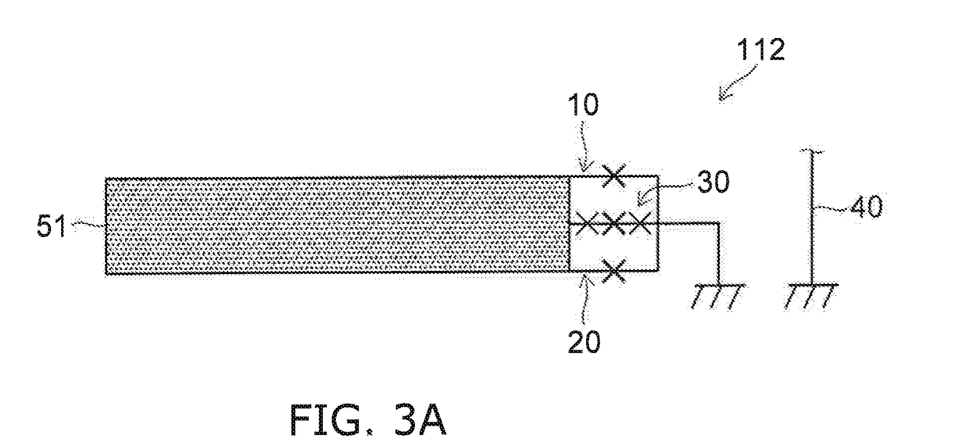
FIG. 3A and FIG. 3B are schematic views illustrating other oscillators according to the second embodiment.
Figure 3B:
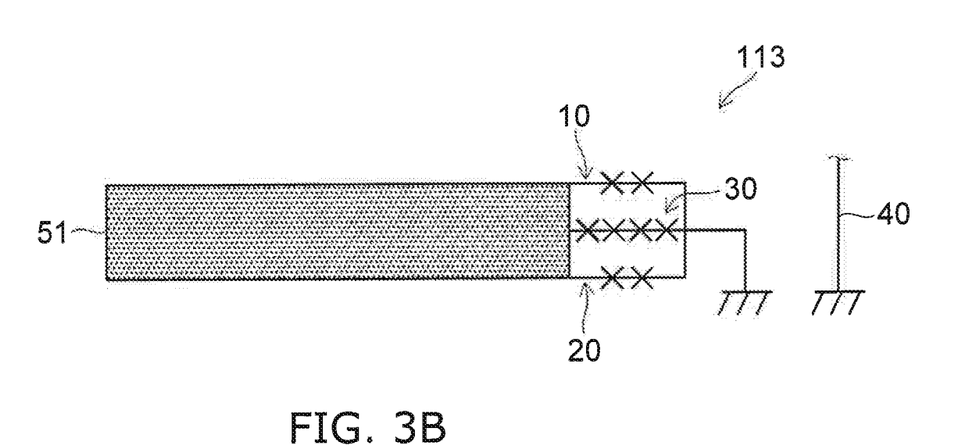

FIG. 3A and FIG. 3B are schematic views illustrating other oscillators according to the second embodiment.

FIG. 3A and FIG. 3B schematically illustrate portions of oscillators 112 and 113 according to the second embodiment as circuit diagrams.

In the oscillator 112 illustrated in FIG. 3A, the number (N3) of Josephson junctions in the third current path 30 is 3.

In the oscillator 113 illustrated in FIG. 3B, the number (N1) of Josephson junctions in the first current path 10 is 2. The number (N2) of Josephson junctions in the second current path 20 is 2. The number (N3) of Josephson junctions in the third current path 30 is 4.

Otherwise, the oscillator 112 and the oscillator 113 are similar to the oscillator 110 shown in FIG. 2A.

Figure 4:
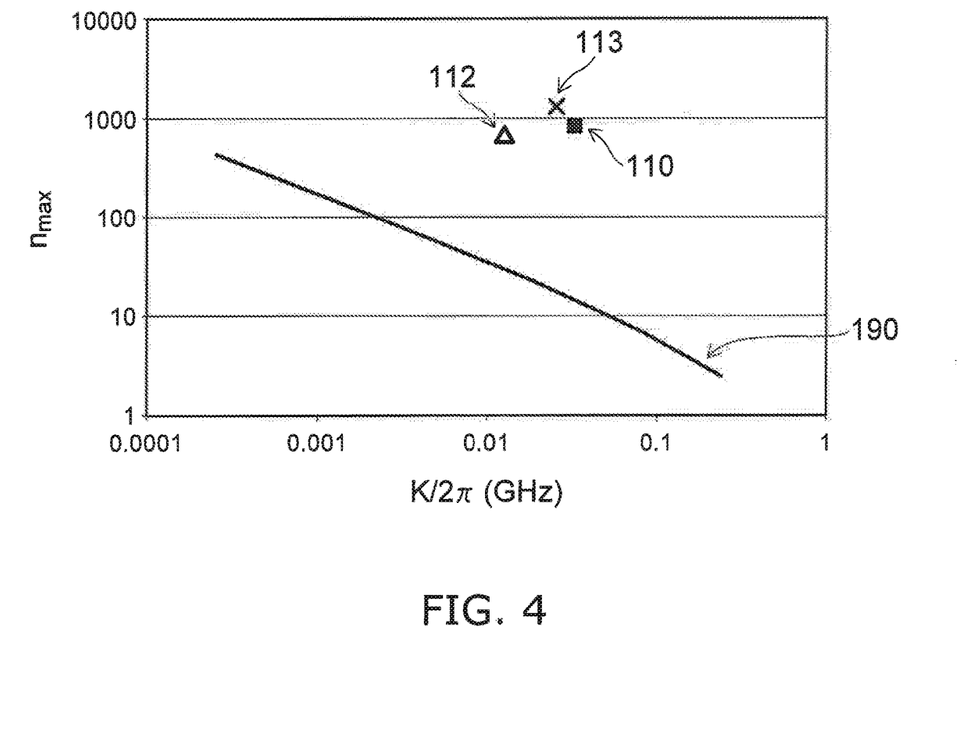
FIG. 4 is a graph illustrating characteristics of the oscillators.

FIG. 4 is a graph illustrating characteristics of the oscillators.

The horizontal axis of FIG. 4 is $K/2\pi$ (GHz (gigahertz)). K is the Kerr coefficient and corresponds to the degree of the nonlinearity of the oscillator. The vertical axis of FIG. 4 is the maximum value ($n_{max}$ (photons)) of the average number of photons inside the oscillator. $n_{max}$ corresponds to the maximum value of the oscillation power of the oscillator.

FIG. 4 illustrates the characteristic of an oscillator 190 of a reference example and the characteristics of the oscillators (the oscillators 110, 112, and 113) according to the second embodiment.

Figure 5A:
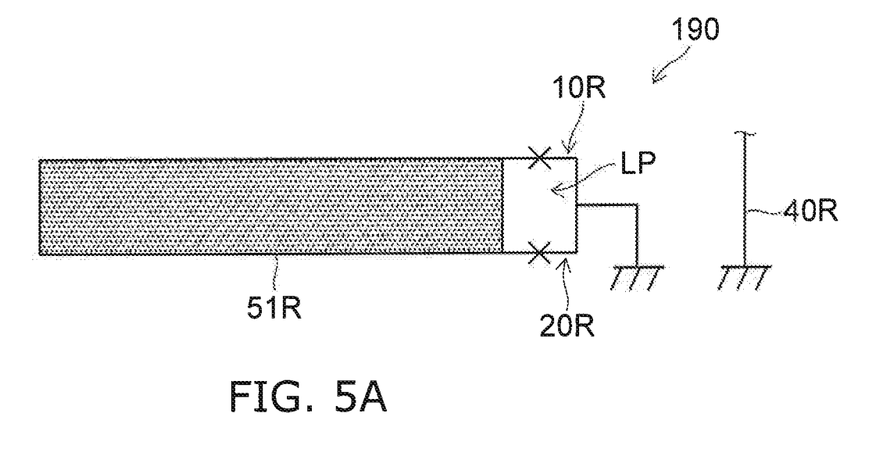
FIG. 5A and FIG. 5B are schematic views illustrating oscillators of reference examples.
Figure 5B:
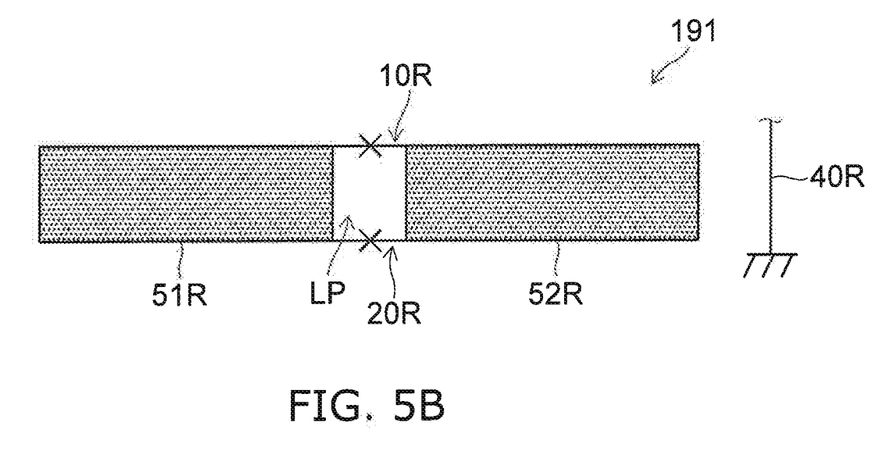

FIG. 5A and FIG. 5B are schematic views illustrating oscillators of reference examples.

FIG. 5A and FIG. 5B schematically illustrate portions of the oscillators 190 and 191 according to the reference examples as circuit diagrams.

As shown in FIG. 5A, the oscillator 190 includes one loop LP (a dc SQUID structure), a waveguide portion 51R, and an electromagnetic wave application portion 40R. The loop LP is formed of a current path 10R including one Josephson junction, and a current path 20R including one Josephson junction. The oscillator 190 of the reference example corresponds to the configuration of the oscillator 110 shown in FIG. 2A in which the third current path 30 is omitted.

As shown in FIG. 5B, compared to the oscillator 190, the oscillator 191 further includes a waveguide portion 52R. The oscillator 191 corresponds to the configuration of the oscillator 111 shown in FIG. 2B in which the third current path 30 is omitted.

As shown in FIG. 4, the inventor of the application discovered that there is a trade-off relationship between the nonlinearity and the maximum value of the oscillation power in the oscillator 190 of the reference example. According to the oscillators (the oscillators 110, 112, and 113) according to the second embodiment, the oscillation power can be improved with respect to the nonlinearity. This will now be described.

First, the oscillator 190 of the reference example will be described. Although the oscillator 190 will now be described, this is similar for the oscillator 191 as well.

The resonance condition that determines a resonance angular frequency $\omega$ is shown in the following formula.

[Formula 1]

$$kl \tan kl = \frac{L_0 l}{\phi_0}|I_{eff}| \quad (1)$$

Here,

[Formula 2]

$$k = \omega\sqrt{L_0 C_0} \quad (2)$$

is the wave number corresponding to the resonance angular frequency $\omega$ ($L_0$ and $C_0$ respectively being the inductance and the capacitance per unit length of the waveguide portion); l is the length of the waveguide portion;

[Formula 3]

$$\phi_0 = \Phi_0/2\pi \quad (3)$$

is the cyclic quantum flux ($\Phi_0$ being the flux quantum); and

[Formula 4]

$$I_{eff} = 2I_c \cos\frac{\pi\Phi}{\Phi_0} \quad (4)$$

is the effective critical current of the dc SQUID ($I_c$ being the critical current of each Josephson junction of the dc SQUID, and $\Phi$ being the flux inside the dc SQUID).

The Hamiltonian is shown in the following formula.

[Formula 5]

$$H = \frac{C_0 l}{4}\left(1 + \frac{\sin 2kl}{2kl}\right)\dot\phi^2 + \frac{(kl)^2}{4L_0}\left(1 - \frac{\sin 2kl}{2kl}\right)\phi^2 - |I_{eff}|\phi_0\cos\frac{\phi\cos kl}{\phi_0} \quad (5)$$

Here, $\phi$ is the flux of the waveguide and is quantized as follows.

[Formula 6]

$$\phi = \sqrt{A}\phi_0(a + a^\dagger) \quad (6)$$

Here,

[Formula 7]

$$a^\dagger, a \quad (7)$$

are the creation and annihilation operators of the photons inside the oscillator; and the dimensionless quantity A is defined by

[Formula 8]

$$A = \frac{\hbar}{C_0 l \omega \phi_0^2\left(1 + \frac{\sin 2kl}{2kl}\right)}. \quad (8)$$

The magnitude K of the Kerr coefficient corresponding to the nonlinearity is shown in the following formula.

[Formula 9]

$$K = \frac{\phi_0|I_{eff}|}{2\hbar}A^2\cos^4 kl \quad (9)$$

On the other hand, when the oscillation state is taken to be the coherent state of the average number of photons n, an expected value I of the current in the dc SQUID is shown in the following formula.

[Formula 10]

$$I = \frac{2k\phi_0}{L_0}\sqrt{An}\sin kl \quad (10)$$

From the condition of this current being smaller than the effective critical current of the dc SQUID, the maximum value of the average number of photons is obtained as in the following formula.

[Formula 11]

$$n_{max} = \frac{L_0^2}{4k^2\phi_0^2 A\sin^2 kl}I_{eff}^2 = \frac{1}{4A\cos^2 kl} \quad (11)$$

Here, the last equality formula is rewritten using the resonance condition.

From the description recited above, the trade-off is apparent between the nonlinearity K and $n_{max}$ determining the upper limit of the oscillation power. Namely, $A\cos^2 kl$ is increased to increase K. However, because $n_{max}$ is inversely proportional to $A\cos^2 kl$, $n_{max}$ decreases undesirably if K is increased. In other words, it is difficult to simultaneously increase K and $n_{max}$.

The nonlinear oscillator according to the second embodiment will now be described. As described above in the second embodiment, the loop LP of the dc SQUID of the oscillator of the reference example is subdivided into two by the current path (the third current path 30, hereinbelow called the Josephson current path) including the Josephson junctions.

Although the oscillator 110 will now be described, this is similar for the oscillators 111, 112, and 113 as well.

The case will now be described where the Josephson current path includes two Josephson junctions having a critical current $I_c'$. Similarly to the description recited above,

[Formula 21]

$$I_{eff} = 2I_c \cos\frac{\pi\Phi}{\Phi_0} \quad (12)$$

is used; and the case of

[Formula 13]

$$I_c' + 2I_{eff} > 0 \quad (13)$$

is considered (there are also cases where $I_{eff}$ is a negative value).

At this time, the resonance condition that determines the resonance angular frequency ω is shown in the following formula.

[Formula 14]

$$kl\tan kl = \frac{L_0 l}{\phi_0}\left(\frac{I_c'}{2} + I_{eff}\right) \quad (14)$$

The Hamiltonian is shown in the following formula.

[Formula 15]

$$H = \frac{C_0 l}{4}\left(1 + \frac{\sin 2kl}{2kl}\right)\dot{\phi}^2 + \frac{(kl)^2}{4L_0}\left(1 - \frac{\sin 2kl}{2kl}\right)\phi^2 - I_{eff}\phi_0\cos\frac{\phi\cos kl}{\phi_0} - 2I_c'\phi_0\cos\frac{\phi\cos kl}{2\phi_0} \quad (15)$$

Here, φ is the flux of the waveguide and is quantized as follows.

[Formula 16]

$$\phi = \sqrt{A}\phi_0(a + a^\dagger) \quad (16)$$

Here,

[Formula 17]

$$a + a^\dagger \quad (17)$$

are the creation and annihilation operators of the photons inside the oscillator; and the dimensionless quantity A is defined by

[Formula 18]

$$A = \frac{\hbar}{C_0 l\omega\phi_0^2\left(1 + \frac{\sin 2kl}{2kl}\right)}. \quad (18)$$

The magnitude K of the Kerr coefficient corresponding to the nonlinearity is shown in the following formula.

[Formula 19]

$$K = \frac{\phi_0}{2\hbar}\left|\frac{I_c'}{8} + I_{eff}\right|A^2\cos^4 kl \quad (19)$$

On the other hand, when the oscillation state is taken to be the coherent state of the average number of photons n, the expected value I of the current in the dc SQUID is shown in the following formula.

[Formula 20]

$$I = \frac{2k\phi_0}{L_0}\sqrt{An}\sin kl \quad (20)$$

Here, from the condition of this current being smaller than the effective critical current $T_{eff}$ of the dc SQUID subdivided by the Josephson current path, the maximum value of the average number of photons is obtained as in the following formula.

[Formula 21]

$$n_{max} = \frac{L_0^2}{4k^2\phi_0^2 A\sin^2 kl}I_{eff}'^2 = \frac{1}{4A\cos^2 kl}\frac{I_{eff}'^2}{\left(\frac{I_c'}{2} + I_{eff}\right)^2} \quad (21)$$

Here,

[Formula 22]

$$I_{eff}' = \max_\phi\left[I_{eff}\sin\frac{\phi\cos kl}{\phi_0} + I_c'\sin\frac{\phi\cos kl}{2\phi_0}\right] = \max_\phi\left[\left(2I_{eff}\cos\frac{\phi\cos kl}{2\phi_0} + I_c'\right)\sin\frac{\phi\cos kl}{2\phi_0}\right] \geq I_c' \quad (22)$$

gives

[Formula 23]

$$n_{max} \geq \frac{1}{4A\cos^2 kl}\frac{I_c'^2}{\left(\frac{I_c'}{2} + I_{eff}\right)^2}. \quad (23)$$

From the description recited above, the trade-off remains in the sense that K is proportional to the square of $A\cos^2 kl$ and $n_{max}$ is inversely proportional to $A\cos^2 kl$; but K and $n_{max}$ can be increased simultaneously by selecting $I_{eff}$ and $I_c'$ to increase the proportionality constants of

[Formula 24]

$$\left|\frac{I_c'}{8} + I_{eff}\right| \quad (24)$$

and

[Formula 25]

$$\frac{I_{eff}'^2}{\left(\frac{I_c'}{2} + I_{eff}\right)^2}. \quad (25)$$

In particular, this is possible by setting $I_{eff}$ to be a negative value.

Here, although the case is described where two Josephson junctions are included in the Josephson current path, K and $n_{max}$ similarly can be increased simultaneously even in the case where the number of Josephson junctions included in the Josephson current path is increased or the number of Josephson junctions included in the dc SQUID is increased.

The calculations of the characteristics shown in FIG. 4 will now be described. Here, as typical values, $\omega/2\pi=10$ GHz, $L_0=0.46$ nH/mm, and $C_0=0.18$ pF/mm. In such a case, in the nonlinear oscillator 190 shown in FIG. 5A, there is a trade-off in which $n_{max}$ decreases undesirably if K is increased as shown by the curve of FIG. 4 (the curve of FIG. 4 is obtained by calculating K and $n_{max}$ while changing $I_{eff}$).

Conversely, it can be seen from FIG. 4 that values can be obtained in the region above the trade-off curve for the oscillators 110, 112, and 113.

For the oscillator 110 shown in FIG. 4 (the structure in which the normal dc SQUID including the two Josephson junctions having the critical current of is subdivided by the current path including the two Josephson junctions having the critical current of $I_c'$), $K/2\pi=32$ MHz and $n_{max}=850$ can be obtained by setting

[Formula 26]

$$I_{eff} = 2I_c \cos\frac{\pi\Phi}{\Phi_0} = -1 \ \mu A \quad (26)$$

and

[Formula 27]

$$I_c' = 3 \ \mu A. \quad (27)$$

Thereby, compared to the conventional structure, K and $n_{max}$ can be increased simultaneously.

For the oscillator 112 shown in FIG. 4 (the structure in which the normal dc SQUID including the two Josephson junctions having the critical current of $I_c$ is subdivided by the current path including the three Josephson junctions having the critical current of $I_c'$), $K/2\pi=12$ MHz and $n_{max}=690$ can be obtained by setting

[Formula 28]

$$I_{eff} = 2I_c \cos\frac{\pi\Phi}{\Phi_0} = -0.4 \ \mu A \quad (28)$$

and

[Formula 29].

$$I_c' = 2.8 \ \mu A \quad (29)$$

Thereby, even in the case of this structure, compared to the reference example, K and $n_{max}$ can be increased simultaneously.

For the oscillator 113 shown in FIG. 4 (the structure in which the dc SQUID including the Josephson junctions expanded to two each for a total of four having the critical current of $I_c$ and subdivided by the current path including the four Josephson junctions having the critical current of $I_c'$), $K/2\pi=25$ MHz and $n_{max}=1350$ can be obtained by setting

[Formula 30]

$$I_{eff} = 2I_c \cos\frac{\pi\Phi}{\Phi_0} = -1 \ \mu A \quad (30)$$

and

[Formula 31].

$$I_c' = 3 \ \mu A \quad (31)$$

Thereby, even in the case of this structure, compared to the reference example, K and $n_{max}$ can be increased simultaneously.

Third Embodiment

A third embodiment relates to a computing device (a quantum computer) utilizing a network of nonlinear oscillators.

Figure 6:
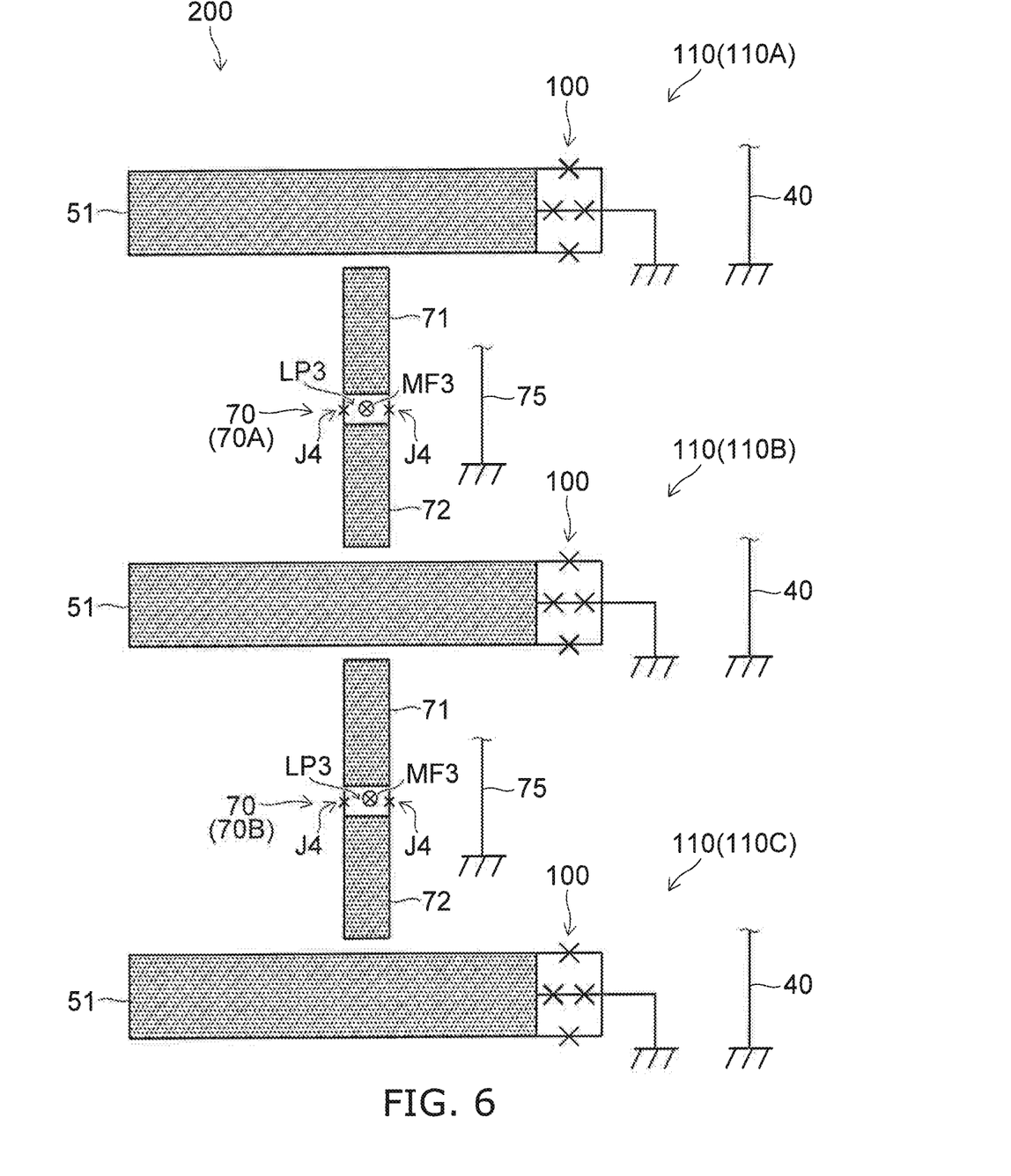
FIG. 6 is a schematic view illustrating a portion of the computing device according to the third embodiment.

FIG. 6 is a schematic view illustrating a portion of the computing device according to the third embodiment.

FIG. 6 schematically illustrates a portion of the computing device 200 according to the third embodiment as a circuit diagram. The computing device 200 is a quantum computer that utilizes the oscillator according to the second embodiment.

As shown in FIG. 6, the computing device 200 multiply includes the oscillator according to the second embodiment. In the example, the computing device 200 includes the multiple oscillators 110 and multiple coupling resonators 70 (superconducting microwave resonators).

The multiple oscillators 110 include, for example, a first oscillator 110A, a second oscillator 110B, and a third oscillator 110C. The multiple coupling resonators 70 include, for example, a first coupling resonator 70A and a second coupling resonator 70B.

Each of the multiple coupling resonators 70 includes a waveguide portion 71 (a first coupling conductive portion), a waveguide portion 72 (a second coupling conductive portion), a third loop LP3, and a magnetic field application portion 75 (a second magnetic field application portion). The third loop LP3 has a dc SQUID structure and includes, for example, two Josephson junctions (fourth Josephson junctions J4). The materials included in the dc SQUID structure of the third loop LP3 are similar to those of the dc SQUID structure described above.

The third loop LP3 is provided between the waveguide portion 71 and the waveguide portion 72 and is electrically connected to each of the waveguide portion 71 and the waveguide portion 72. The materials of the waveguide portion 71 and the waveguide portion 72 are, for example, similar to the material of the waveguide portion 51.

The first oscillator 110A and the second oscillator 110B are coupled to each other via the coupling resonator 70 (the first coupling resonator 70A). The second oscillator 110B and the third oscillator 110C are coupled to each other via the coupling resonator 70 (the second coupling resonator 70B).

In other words, for example, the waveguide portion 71 of the first coupling resonator 70A is capacitively coupled to the waveguide portion 51 of the first oscillator 110A. The waveguide portion 72 of the first coupling resonator 70A is capacitively coupled to the waveguide portion 52 of the second oscillator 110B.

For example, the waveguide portion 71 of the second coupling resonator 70B is capacitively coupled to the waveguide portion 51 of the second oscillator 110B. For example, the waveguide portion 72 of the second coupling resonator 70B is capacitively coupled to the waveguide portion 51 of the third oscillator 110C.

The magnetic field application portion 75 applies an electromagnetic wave to the third loop LP3. The magnetic field application portion 75 is a conductive portion in which an external current for exciting the mode of the dc SQUID flows. The magnetic field application portion 75 can adjust (control) the dc flux (a third flux MF3) inside the dc SQUID (inside the third loop LP3) by a direct current flowing in the magnetic field application portion 75.

Quantum computing is executed by adjusting the coupling strength between the multiple oscillators by using an external current to adjust the fluxes inside the couplers (the first and second coupling resonators). Each of the oscillators includes a read portion; and the state of the oscillator is read via the read portion. For example, the read portion includes a conductor capacitively coupled to the waveguide portion 51. For example, an electromagnetic wave that corresponds to the state of the electronic circuit 100 propagates through the read portion and is measured by a measuring device connected to the read portion.

Fourth Embodiment

A fourth embodiment relates to a quantum bit using the electronic circuit 100.

Figure 7A:
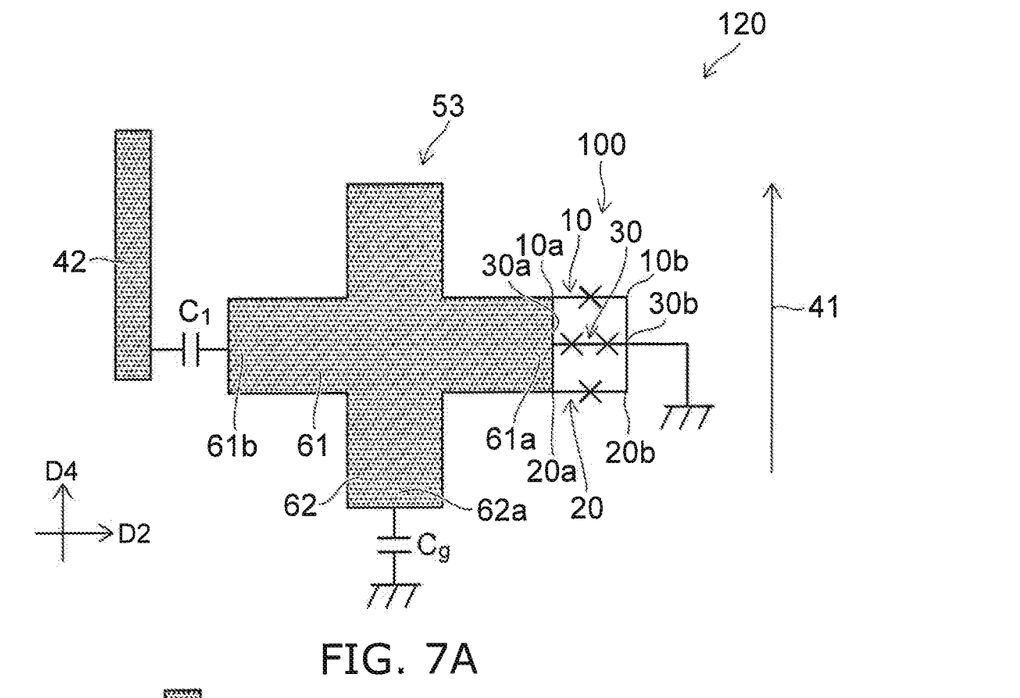
FIG. 7A and FIG. 7B are schematic views illustrating quantum bits according to the fourth embodiment.
Figure 7B:
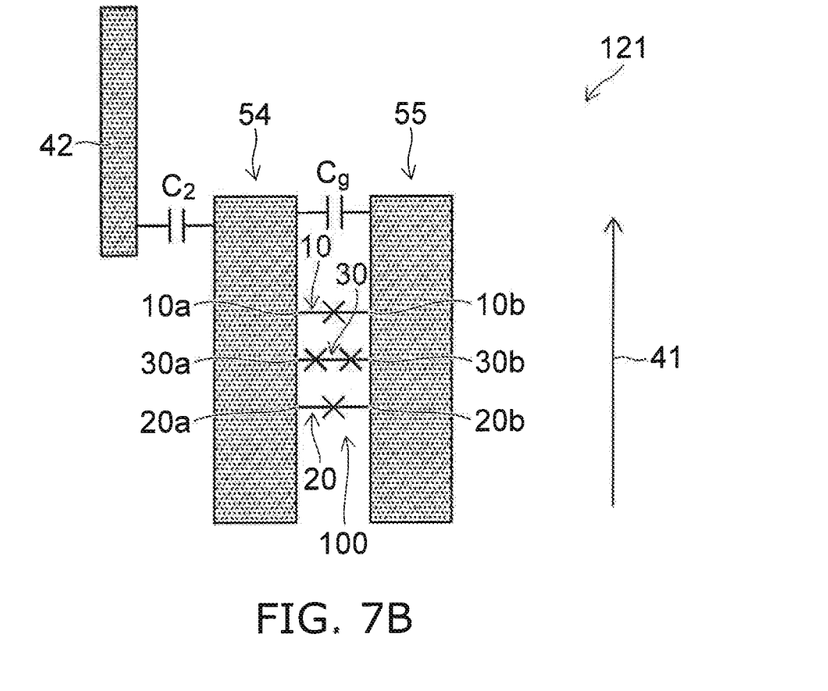

FIG. 7A and FIG. 7B are schematic views illustrating quantum bits according to the fourth embodiment.

FIG. 7A and FIG. 7B schematically illustrate portions of quantum bits 120 and 121 according to the fourth embodiment as circuit diagrams.

As shown in FIG. 7A, the electronic circuit 100, the magnetic field application portion 41, an electromagnetic wave application portion 42 (a second electromagnetic wave application portion), and a conductor portion 53 are provided in the quantum bit 120. As shown in FIG. 7B, the electronic circuit 100, the magnetic field application portion 41, the electromagnetic wave application portion 42, a conductor portion 54, and a conductor portion 55 are provided in the quantum bit 121.

For example, the electromagnetic wave application portion 42 and the conductor portions 53 to 55 each are conductors (superconductors) including materials similar to the conductive portions of the electronic circuit 100. The materials of the electromagnetic wave application portion 42 and the conductor portions 53 to 55 may be different from those of the conductive portions of the electronic circuit 100.

In the example shown in FIG. 7A, the conductor portion 53 includes a first portion 61 that extends in the second direction D2, and a second portion 62 that extends in a fourth direction D4. The fourth direction D4 is a direction crossing the second direction D2. The second portion 62 crosses the first portion 61.

One end 61a of the first portion 61 is electrically connected to each of the one end 10a of the first current path 10, the one end 20a of the second current path 20, and the one end 30a of the third current path 30. The other end 10b of the first current path 10, the other end 20b of the second current path 20, and the other end 30b of the third current path 30 each are connected to the ground potential.

For example, another end 61b of the first portion 61 is capacitively coupled to the electromagnetic wave application portion 42 via a capacitance ($C_1$). For example, an end portion 62a of the second portion 62 is capacitively coupled to the ground potential via a capacitance ($C_g$). The electromagnetic wave application portion 42 applies an electromagnetic wave to at least one of the one end 10a of the first current path 10, the one end 20a of the second current path 20, or the one end 30a of the third current path 30 via the capacitance ($C_1$) and the conductor portion 53.

In the example shown in FIG. 7B, the one end 10a of the first current path 10, the one end 20a of the second current path 20, and the one end 30a of the third current path 30 each are electrically connected to the conductor portion 54. The one end 10a of the first current path 10, the one end 20a of the second current path 20, and the one end 30a of the third current path 30 each are electrically connected to the conductor portion 55.

For example, the conductor portion 55 is capacitively coupled to the conductor portion 54 via the capacitance ($C_g$). For example, the conductor portion 54 is capacitively coupled to the electromagnetic wave application portion 42 via a capacitance ($C_2$). The electromagnetic wave application portion 42 applies an electromagnetic wave to at least one of the one end 10a of the first current path 10, the one end 20a of the second current path 20, or the one end 30a of the third current path 30 via the capacitance ($C_2$) and the conductor portion 54.

In the quantum bit according to the embodiment, for example, a large nonlinearity can be achieved; and faster operations are possible. Examples will now be described.

Figure 8A:
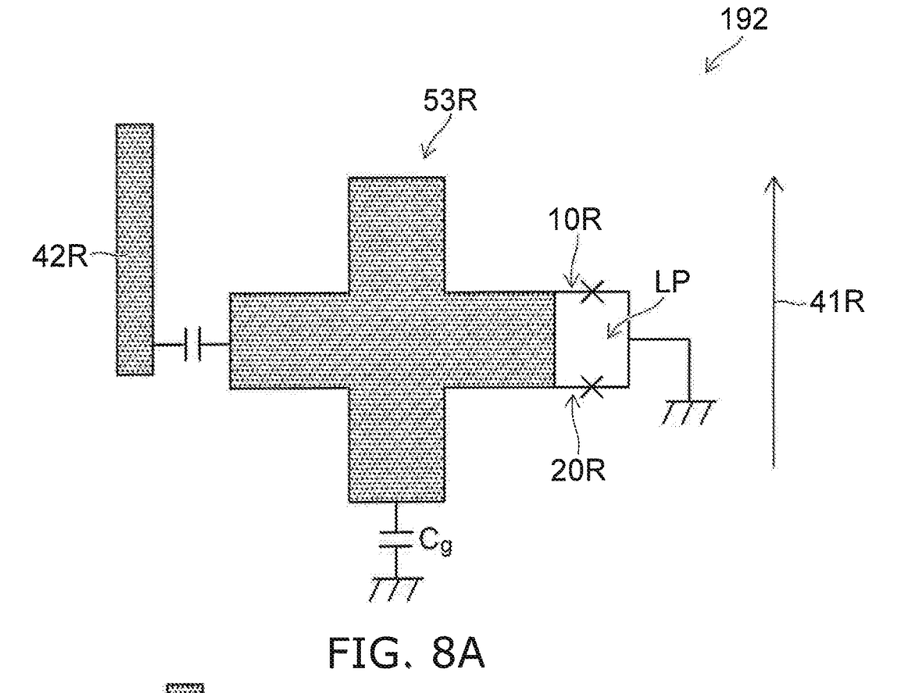
FIG. 8A and FIG. 8B are schematic views illustrating quantum bits of reference examples.
Figure 8B:
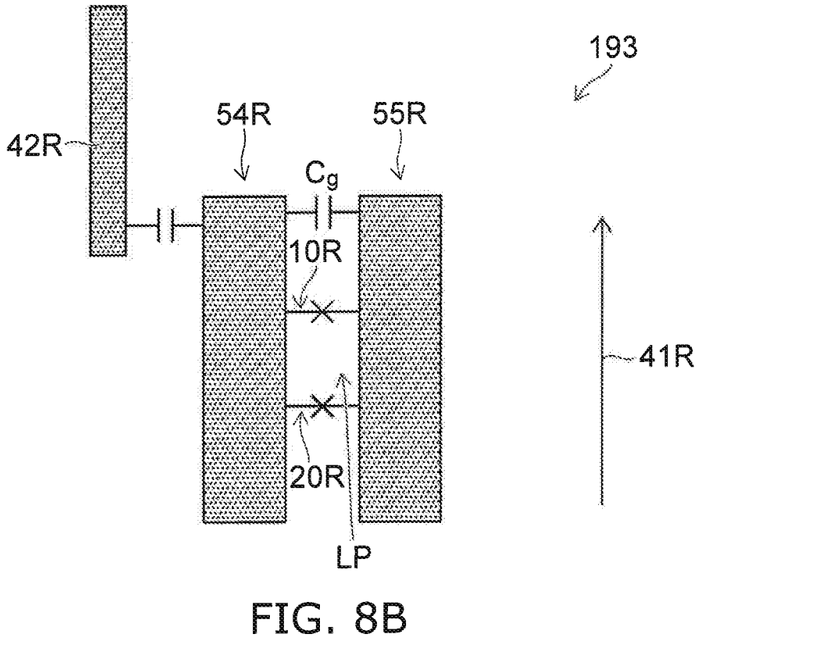

FIG. 8A and FIG. 8B are schematic views illustrating quantum bits of reference examples.

FIG. 8A and FIG. 8B respectively illustrate quantum bits 192 and 193 according to reference examples (Nature 519, 66-69 (2015) and Nature Commun. 6, 6983 (2015)).

The loop LP (the dc SQUID structure), a magnetic field application portion 41R, an electromagnetic wave application portion 42R, and a conductor portion 53R are provided in the quantum bit 192 of the reference example shown in FIG. 8A. The quantum bit 192 of the reference example corresponds to the configuration of the quantum bit 120 shown in FIG. 7A in which the third current path 30 is omitted.

The loop LP (the dc SQUID structure), the magnetic field application portion 41R, the electromagnetic wave application portion 42R, a conductor portion 54R, and a conductor portion 55R are provided in the quantum bit 193 of the reference example shown in FIG. 8B. The quantum bit 193 of the reference example corresponds to the configuration of the quantum bit 121 shown in FIG. 7B in which the third current path 30 is omitted.

For example, the Hamiltonian of the quantum bit of the reference example is shown in the following formula.

[Formula 32]

$$H = \frac{C_g}{2}\dot{\phi}^2 - I_{eff}\phi_0\cos\frac{\phi}{\phi_0} \quad (32)$$

Here, $C_g$ is the capacitance shown in FIG. 8A or FIG. 8B; and $I_{eff}$ is the effective critical current of the dc SQUID similar to Formula (4). Rewriting using the two frequencies defined by the following formula

[Formula 33]

$$v_C = \frac{e^2}{2C_g h}, \; v_{eff} = \frac{I_{eff}\phi_0}{h} \quad (33)$$

gives the following (h being Planck's constant and e being the elementary charge).

[Formula 34]

$$H = \frac{h}{16v_C(2\pi)^2}\left(\frac{\dot{\phi}}{\phi_0}\right)^2 - hv_{eff}\cos\frac{\phi}{\phi_0} \quad (34)$$

Here,
[Formula 35]

$$E_{01} \approx h\sqrt{8v_C v_{eff}} \quad (35)$$

and
[Formula 36]

$$E_{01} - E_{12} \approx hv_c \quad (36)$$

hold. The nonlinearity is determined only by the capacitance $C_g$. As a typical value, $v_C$=200 MHz. This limits the speed of the operation of the quantum bit, Although $C_g$ may be reduced to increase the nonlinearity to increase the speed of the operation, doing so would undesirably increase the dephasing caused by the charge fluctuation; therefore, normally, a value of about this value is used.

For example, the Hamiltonian of the quantum bit of the embodiment is shown in the following formula.

[Formula 37]

$$H = \frac{C_g}{2}\dot{\phi}^2 - I_{eff}\phi_0\cos\frac{\phi}{\phi_0} - 2I'_c\phi_0\cos\frac{\phi}{2\phi_0} \quad (37)$$

Here, the flux inside the dc SQUID is set to the flux quantum ($\Phi=\Phi_0$). At this time, the effect of the flux fluctuation is the smallest; and $I_{eff}<0$. At this time, the Hamiltonian is as follows.

[Formula 38]

$$H = \frac{C_g}{2}\dot{\phi}^2 + 2I_c\phi_0\cos\frac{\phi}{\phi_0} - 2I'_c\phi_0\cos\frac{\phi}{2\phi_0} \quad (38)$$

Rewriting the Hamiltonian using

[Formula 39]

$$v_C = \frac{e^2}{2C_g h}, \; v_c = \frac{2I_c\phi_0}{h}, \; v'_c = \frac{2I'_c\phi_0}{h} \quad (39)$$

gives

[Formula 40]

$$H = \frac{h}{16v_C(2\pi)^2}\left(\frac{\dot{\phi}}{\phi_0}\right)^2 + hv_c\cos\frac{\phi}{\phi_0} - hv'_c\cos\frac{\phi}{2\phi_0}. \quad (40)$$

$E_{01}-E_{12}\approx -2$ GHz is obtained by setting $v_c$ to be the same 200 MHz as recited above and setting $v'_c=4v_c\times 20$ GHz so that $E_{01}/h$ is a typical value of about 6 GHz. The degree of the nonlinearity is about 10 times the case of the reference example. Thus, according to the quantum bit according to the embodiment, compared to the quantum bit of the reference example even when using the same capacitance, greater nonlinearity (the magnitude $|E_{01}-E_{12}|$ of the difference between the energy difference $E_{01}$ between the base state and a first excited state and the energy difference $E_{12}$ between the first excited state and a second excited state) can be achieved.

Fifth Embodiment

Figure 9:
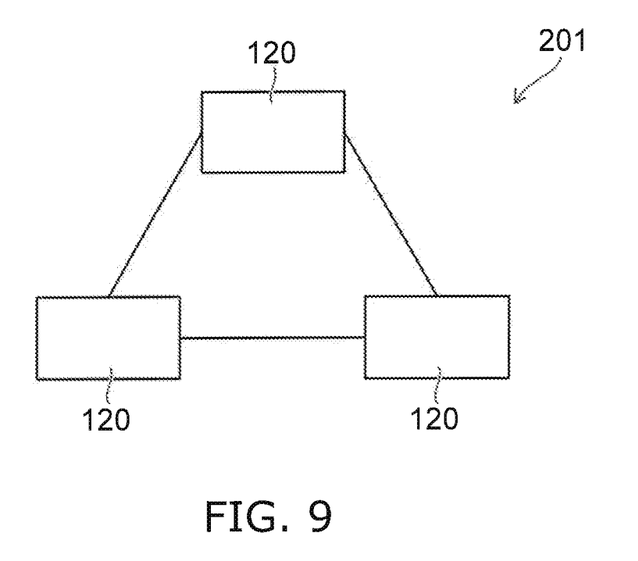
FIG. 9 is a schematic view illustrating a computing device according to a fifth embodiment.

FIG. 9 is a schematic view illustrating a computing device according to a fifth embodiment.

As shown in FIG. 9, the computing device according to the fifth embodiment includes the quantum bit 120 or the quantum bit 121 according to the fourth embodiment. In the example, the computing device 201 includes the multiple quantum bits 120. The multiple quantum bits 120 are coupled to each other to form a network. Each of the quantum bits 120 includes a read portion; and the state of the quantum bit 120 is read via the read portion. For example, a conductor that is capacitively coupled to the conductor portion 53 is included in the read portion.

In the embodiments, the state of being electrically connected includes not only the state in which multiple conductors are in direct contact, but also the case where the multiple conductors are connected via another conductor.

According to the embodiments, a novel electronic circuit, oscillator, quantum bit, and computing device can be provided.

Hereinabove, embodiments of the invention are described with reference to specific examples. However, the invention is not limited to these specific examples. For example, one skilled in the art may similarly practice the invention by appropriately selecting specific configurations of components such as the first to third current paths, the electromagnetic wave application portions, the coupling resonators, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all electronic circuits, oscillators, quantum bits, and computing devices practicable by an appropriate design modification by one skilled in the art based on the electronic circuits, the oscillators, the quantum bits, and the computing devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic circuit, comprising:
a first current path including a first Josephson junction;
a second current path including a second Josephson junction; and
a third current path including a plurality of third Josephson junctions,
one end of the second current path being electrically connected to one end of the first current path,
another end of the second current path being electrically connected to another end of the first current path,
one end of the third current path being electrically connected to the one end of the first current path and the one end of the second current path,
another end of the third current path being electrically connected to the other end of the first current path and the other end of the second current path,
wherein:
a number of the third Josephson junctions is larger than a number of the first Josephson junctions and larger than a number of the second Josephson junctions,
the number of the first Josephson junctions is equal to the number of the second Josephson junctions,
the first path and the third path form a first loop,
the second path and the third path form a second loop, and
the configuration of the second loop is symmetrical with the configuration of the first loop around the third current path.

2. The circuit according to claim 1, wherein a position of a portion of the third current path in a first direction is provided between a position of a portion of the first current path in the first direction and a position of a portion of the second current path in the first direction, the first direction being from the portion of the first current path toward the portion of the second current path.

3. The circuit according to claim 1, wherein a surface area of a region surrounded with the second current path and the third current path is not less than 0.9 times and not more than 1.1 times a surface area of a region surrounded with the first current path and the third current path.

4. The circuit according to claim 1, further comprising a first electromagnetic wave application portion applying an electromagnetic wave to each of a first region and a second region, the first region being surrounded with the first current path and the third current path, the second region being surrounded with the second current path and the third current path.

5. An oscillator, comprising the electronic circuit according to claim 4,
the electronic circuit being caused to oscillate by the first electromagnetic wave application portion modulating each of a first flux and a second flux, the first flux being inside the first region, the second flux being inside the second region.

6. The oscillator according to claim 5, wherein the first electromagnetic wave application portion sets a direct current component of the second flux inside the second region to be not less than 0.8 times and not more than 1.2 times a direct current component of the first flux inside the first region.

7. The oscillator according to claim 6, wherein the direct current component of the second flux is not less than 0.9 times and not more than 1.1 times the direct current component of the first flux.

8. The oscillator according to claim 5, further comprising a first magnetic field application portion applying a magnetic field to the first region and the second region,
the first magnetic field application portion adjusting at least one of the first flux inside the first region or the second flux inside the second region.

9. The oscillator according to claim 8, further comprising a first waveguide portion electrically connected to each of the one end of the first current path, the one end of the second current path, and the one end of the third current path.

10. The oscillator according to claim 9, further comprising a second waveguide portion electrically connected to each of the other end of the first current path, the other end of the second current path, and the other end of the third current path.

11. A computing device, comprising:
a first oscillator according to claim 5; and
a second oscillator according to claim 5,
the second oscillator being coupled to the first oscillator.

12. The device according to claim 11, further comprising a coupling resonator including a loop including a fourth Josephson junction,
the first oscillator being coupled to the second oscillator via the coupling resonator.

13. The device according to claim 12, wherein
the coupling resonator further includes:
a first coupling conductive portion capacitively coupled to the first oscillator; and
a second coupling conductive portion capacitively coupled to the second oscillator, and
the loop is electrically connected to each of the first coupling conductive portion and the second coupling conductive portion.

14. The device according to claim 12, wherein the coupling resonator further includes a second magnetic field application portion modulating a third flux inside the loop.

15. A quantum bit circuit, comprising the electronic circuit according to claim 1.

16. The quantum bit circuit, according to claim 15, further comprising a first magnetic field application portion adjusting at least one of a first flux or a second flux, the first flux being inside a first region surrounded with the first current path and the third current path, the second flux being inside a second region surrounded with the second current path and the third current path.

17. The quantum bit circuit, according to claim 15, further comprising a second electromagnetic wave application portion applying an electromagnetic wave to at least one of the one end of the first current path, the one end of the second current path, or the one end of the third current path.

18. A computing device, comprising a plurality of quantum bit circuits according to claim 15.

* * * * *